(12) United States Patent
Hsu (10) Patent No.: US 11,362,094 B2
(45) Date of Patent: Jun. 14, 2022

(54) MEMORY DEVICE AND METHOD OF MANUFACTURING THE SAME

(71) Applicant: Winbond Electronics Corp., Taichung (TW)

(72) Inventor: Chia-Lan Hsu, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 62 days.

(21) Appl. No.: 17/118,894

(22) Filed: Dec. 11, 2020

(65) Prior Publication Data

US 2021/0183863 A1 Jun. 17, 2021

(30) Foreign Application Priority Data

Dec. 11, 2019 (TW) ................................. 108145355

(51) Int. Cl.
*H01L 27/108* (2006.01)
*H01L 29/06* (2006.01)
*H01L 23/522* (2006.01)

(52) U.S. Cl.
CPC .... *H01L 27/10805* (2013.01); *H01L 23/5226* (2013.01); *H01L 27/10844* (2013.01); *H01L 29/0649* (2013.01)

(58) Field of Classification Search
CPC ......... H01L 27/10805; H01L 27/10844; H01L 23/5226; H01L 29/0649

USPC .......................................................... 257/296
See application file for complete search history.

(56) References Cited

U.S. PATENT DOCUMENTS 10,475,900 B2 * 11/2019 Chang ................. H01L 21/2855

\* cited by examiner

*Primary Examiner* — Tu-Tu V Ho
(74) *Attorney, Agent, or Firm* — Muncy Geissler Olds & Lowe P.C.

(57) ABSTRACT

A memory device and its manufacturing method are provided, including: a semiconductor substrate, including a shallow trench isolation structure and an active area positioned at one side of the shallow trench isolation structure; two buried word lines and a first dielectric layer, wherein the buried word lines are disposed in the semiconductor substrate and separated from each other, the first dielectric layer is disposed on the semiconductor substrate and corresponds to the two buried word lines; a contact plug disposed on the semiconductor substrate and within the active area, including a conductive layer and an epitaxial layer, the conductive layer is disposed on the sidewalls of the first dielectric layer, the epitaxial layer is disposed on the sidewalls of the conductive layer and extends into the semiconductor substrate; a second dielectric layer disposed over the semiconductor substrate, covering the contact plug and the shallow trench isolation structure.

11 Claims, 12 Drawing Sheets

MEMORY DEVICE AND METHOD OF MANUFACTURING THE SAME

CROSS REFERENCE TO RELATED APPLICATIONS

This application claims priority of Taiwan Patent Application No. 108145355 filed on Dec. 11, 2019 the entirety of which are incorporated by reference herein.

BACKGROUND

Technical Field

The present disclosure is related to a memory device, and specifically to a dynamic random access memory device, and a method of manufacturing the same.

Description of the Related Art

As the semiconductor technology elevates, to comply with consumers' needs for miniaturized electronic devices, the memory units of the dynamic random access memory (DRAM) devices are miniaturized, while the integration degree of the memory units is increased. The development of the buried word line dynamic random access memory device is designed for satisfying the needs for increasing integration degree of the dynamic random access memory devices, to accelerate operating speed of the device. Furthermore, isolation structures (such as shallow trench isolation structures) may be further developed within the buried word line dynamic random access memory device, to prevent interference between word lines.

In conventional processes of the various elements, such as isolation structures, buried word lines, bit lines, and capacitor contacts (also known as contact plugs) used to form memory devices, the procedures performed are prone to misalignment. As the integration degree of the memory device is continuously increased, the distances between word lines and between isolation structures are also continuously shrunk, causing more issues with severe misalignment. For example, capacitor contacts (also known as contact plugs) over the semiconductor substrate are misaligned, in which the contact areas between the capacitor contacts and active areas are reduced, causing the resistance between the capacitor contact and the active areas to increase, thereby adversely affecting the electric performance of the memory devices. Furthermore, the surface of the semiconductor substrate exposed due to misalignment may be damaged from etching process, thereby degrading the reliability of the memory device. Therefore, how to prevent the happening of the aforementioned cases has become an important matter.

SUMMARY

The embodiments of the present disclosure disclose a memory device, including a semiconductor substrate, wherein the semiconductor substrate includes a shallow trench isolation structure and an active area disposed on one side of the shallow trench isolation structure. The memory device also includes two adjacent buried word lines and a first dielectric layer, wherein the buried word lines are disposed in the semiconductor substrate and separating from each other, the first dielectric layer is disposed on the semiconductor substrate and correspondingly above the two adjacent buried word lines. The memory device further includes a contact plug disposed on the semiconductor substrate within the active area. The contact plug includes a conductive layer and an epitaxial layer, wherein the conductive layer is disposed on sidewalls of the first dielectric layer, and the epitaxial layer is disposed on sidewalls of the conductive layer and extending into the semiconductor substrate. The memory device also includes a second dielectric layer disposed on the semiconductor substrate and covering the contact plug and the shallow trench isolation structure.

The embodiments of the present disclosure disclose a method of manufacturing a memory device, including: providing a semiconductor structure, including a semiconductor substrate, a shallow trench isolation structure in the semiconductor substrate, a dielectric layer on the semiconductor substrate, and a conductive material on the semiconductor substrate and covering the semiconductor substrate. The method of manufacturing the memory device also includes performing etching on the conductive material to expose the shallow trench isolation structure and to remove a portion of the semiconductor substrate, thereby forming a recess on the semiconductor substrate, wherein the conductive material remains after the etching is a conductive layer, and the conductive layer is disposed on sidewalls of the dielectric layer. The method of manufacturing the memory device also includes performing epitaxial growth to form an epitaxial layer on sidewalls of the conductive layer, wherein the epitaxial layer fills the recess.

BRIEF DESCRIPTION OF THE DRAWINGS

The present disclosure can be further understood by reading the subsequent detailed description and examples with references made to the accompanying drawings, wherein:

FIGS. 2A-2G are cross-sectional views corresponding to each of the procedures manufacturing the memory device according to some embodiments of the present disclosure. Wherein, FIGS. 2A-2G are illustrated corresponding to cross-sectional line 2-2 of FIG. 1.

DETAILED DESCRIPTION

The present disclosure is described in detail with reference to the figures of the embodiments of the present disclosure. It should be appreciated, however, that the present disclosure can be embodied in a wide variety of implements and is not limited to embodiments described in the disclosure. Various layers and areas in the figures may be arbitrarily drawn in different scales for the sake of simplicity and clarity. Throughout the various views and illustrative embodiments, like reference numbers are used to designate like elements, which will not be mentioned again thereafter to avoid repetition.

The present disclosure provides a memory device and a method of manufacturing the same to form contact plugs including conductive layers and epitaxial layers. The reduced contact areas between active areas and the contact plugs due to offset in conventional process and the damage issues to the semiconductor substrate may be alleviated to elevate electrical characteristics and operating performance of the memory device. Furthermore, in some embodiments, for example, the conductive layers formed of self-aligned etching and the epitaxial layers formed of selective epitaxial growth may simplify process procedures by reducing the quantity of masks used, thereby lowering process cost.

Additionally, the memory device proposed by the embodiments may be, for example, a dynamic random access memory (DRAM), which is illustrated by buried word lines dynamic random access memory. The accompanying drawings of the embodiments illustrate an active area including two buried word lines of the memory device. However, the present disclosure is not limited hereto.

Figure 1:
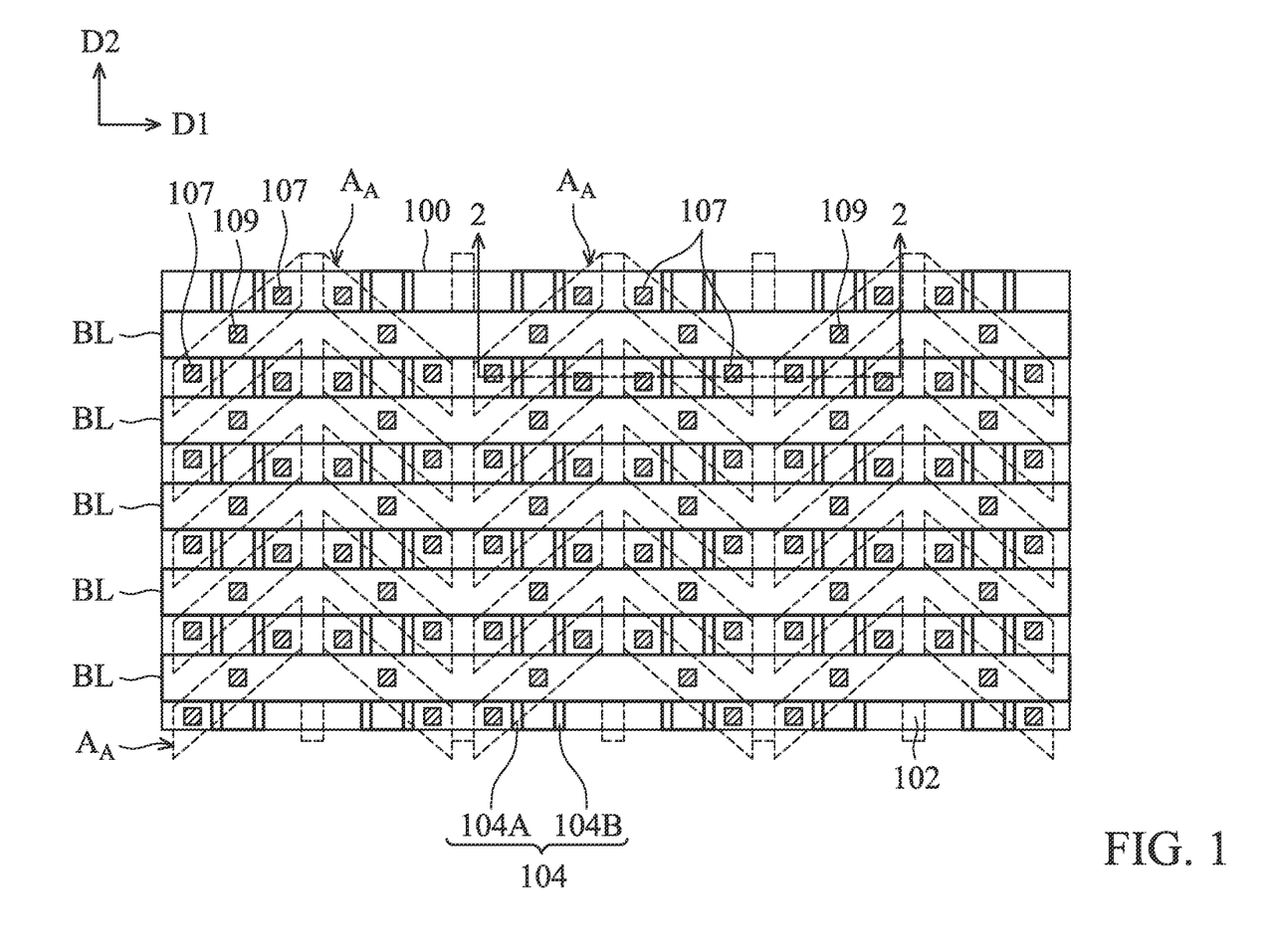
FIG. 1 is a top view of a memory device according to some embodiments of the present disclosure.

As shown in FIG. 1, a memory device of some embodiments includes: a semiconductor substrate 100, a plurality of shallow trench isolation (STI) structures 102, a plurality of active areas $A_A$, a plurality of bit lines BL, a plurality of word line groups 104, a plurality of capacitor contacts 107, and a plurality of bit line contacts 109. FIG. 1 only illustrates the aforementioned elements for simplicity and clarity. However, the memory device may include other elements, in which the structural details of the elements may be described accompanying the cross-sectional views of FIGS. 2A-2G and 4A-4C.

In this embodiment, the semiconductor substrate 100 may have the plurality of active areas $A_A$ formed therein. Each of the active areas $A_A$ may be arranged approximately along a first direction D1, and forms an intersection with the first direction D1. The semiconductor substrate 100 may have the plurality of shallow trench isolation structures 102 formed therein along a second direction D2, wherein two adjacent active areas $A_A$ are separated by one shallow trench isolation structure 102 therebetween. The first direction D1 is different from the second direction D2. In one embodiment, the first direction D1 and the second direction D2 may approximately perpendicular with each other. Furthermore, in this embodiment, active areas $A_A$ are in linear shapes, but the present disclosure is not limited hereto.

The memory device of some embodiments may further include the plurality of bit lines BL on the semiconductor substrate 100. Each of the bit lines BL may extend along the first direction D1, and adjacent bit lines are separately arranged on the second direction D2. The plurality of word line groups 104 may be disposed in the semiconductor substrate 100 and extending along the second direction D2, respectively. In some embodiments, each of the word line groups 104 may have two buried word lines 104A and 104B, and the adjacent buried word lines 104A and 104B are separately arranged on the first direction D1.

As shown in FIG. 1, each of the active areas $A_A$ may span across one corresponding word line group 104 (for example, including buried word lines 104A and 104B), and each of the active areas $A_A$ and the corresponding bit line BL may have an overlapping region (for example, the middle section of the active area $A_A$) and non-overlapping regions on opposite sides of the overlapping region. In each of the active areas $A_A$, the two non-overlapping regions of the corresponding bit line BL may each have a capacitor contact 107. In some embodiments, capacitor contacts 107 may be disposed on the semiconductor substrate 100, and each of the capacitor contacts 107 may be disposed between two adjacent bit lines BL. Two capacitor contacts 107 corresponding to each of the active areas $A_A$ are assigned on opposite sides of the word line group 104 penetrating this active area $A_A$, respectively.

Furthermore, the overlapping region of each of the active areas $A_A$ and bit line BL may have a bit line contact 109.

When each of the bit lines BL spans across the corresponding word ling group 104, the bit line contact 109 may be used to electrically connect a doped region (not shown) between the corresponding buried word lines 104A and 104B.

Additionally, the shapes of the capacitor contacts 107 and the bit line contacts 109 in FIG. 1 are not limited to rectangular, in which the shapes and the dimensions may be adjusted and designed based on the process or application need.

To simplify the drawings for clarity, FIGS. 2A-2G illustrate a related manufacturing method and a structure corresponding to three word line groups 104 of the memory device.

Figure 2A:
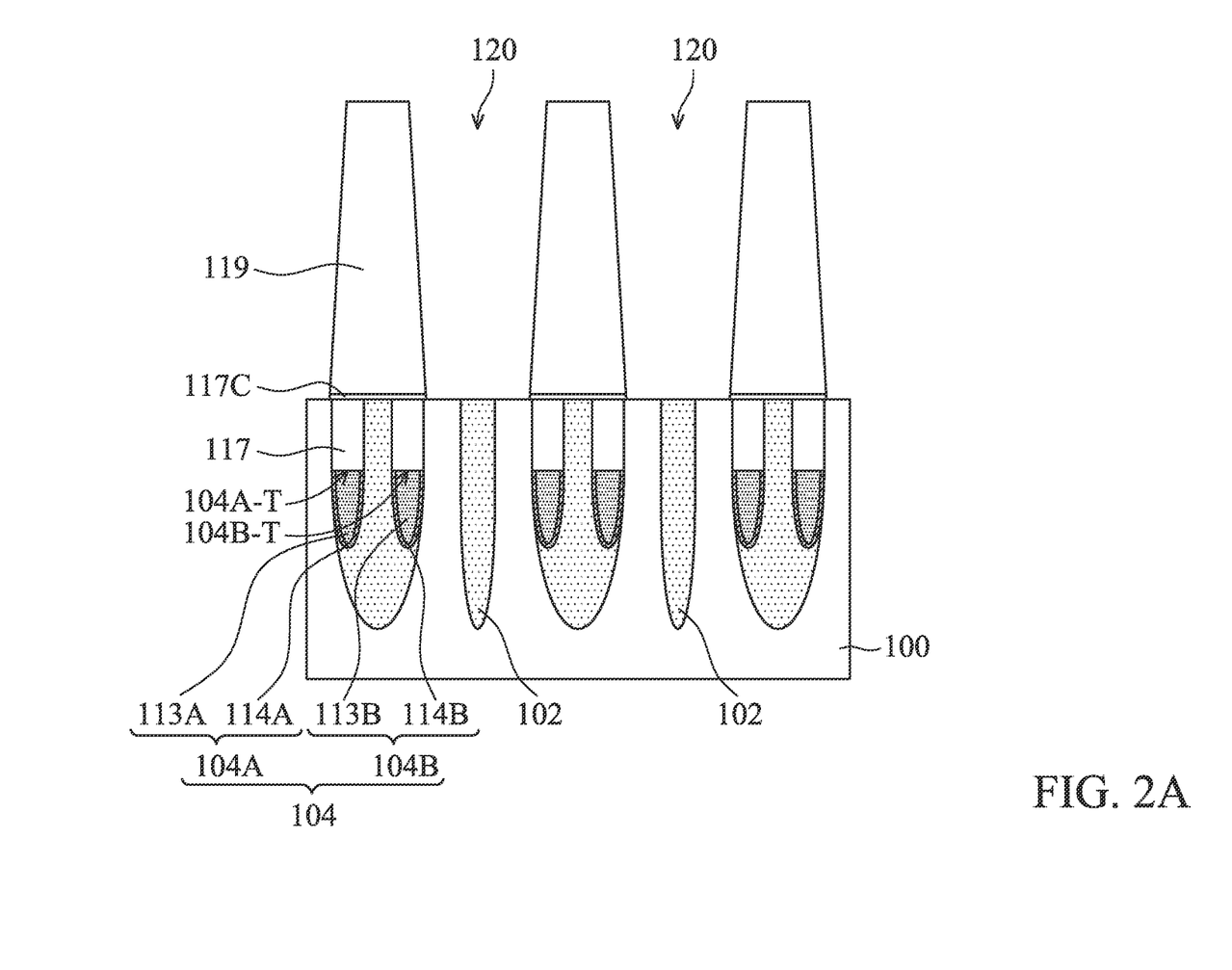

Refer to FIGS. 1 and 2A. A semiconductor substrate 100 is provided, and the semiconductor substrate 100 may include a plurality of shallow trench isolation structures 102 extending along a second direction D2, and a plurality of active areas $A_A$ separated by the shallow trench isolation structures 102, respectively. The active areas $A_A$ separately arranged on the second direction D2 may also be separated by the shallow trench isolation structures 102. The semiconductor substrate 100 may be, for example, a silicon substrate. The shallow trench isolation structures 102 may be, for example, oxide formed of deposition processes.

Furthermore, the provided semiconductor substrate 100 may also include a plurality of word ling groups 104 therein, while each of the word line groups 104 may include two adjacent buried word lines 104A and 104B, which are separated by isolation materials, such as oxide. In this embodiment, the isolation materials are the same with materials of the shallow trench isolation structures 102, and the bottom surface of the isolation material is lower than the bottom surface of each of the word line groups 104, to reduce interference between word line groups 104. Each of the buried word lines 104A or 104B may include a gate 113A or 113B and a gate dielectric 114A or 114B surrounding the gate 113A or 113B, wherein the gate dielectric 114A or 114B is disposed such that the gate 113A or 113B is electrically insulated from the semiconductor substrate 100.

Materials of the gates 113A and 113B may be, for example, copper, tungsten, tungsten nitride, titanium nitride, or other suitable conductive materials. The gates 113A and 113B may be formed by single-layer structures or multi-layer structures. For example, the gates 113A and 113B may include tungsten and titanium nitride. The formation of the gates 113A and 113B may be chemical vapor deposition (CVD) or physical vapor deposition (PVD). Additionally, materials of the gate dielectrics 114A and 114B may be, for example, silicon oxide, which may be formed of chemical vapor deposition.

Furthermore, in some embodiments, there may be insulation layers formed. As shown in FIG. 2A, a silicon nitride layer 117 is formed over each of the buried word lines 104A and 104B. In some embodiments, within each of the word line groups 104, a silicon nitride layer 117C is formed over the two silicon nitride layers 117 on the buried word lines 104A and 104B. The silicon nitride layers 117 and 117C may be formed of chemical vapor deposition.

Furthermore, in some embodiments, there may also be a first dielectric layer 119 formed over each of the word line groups 104 of the provided semiconductor substrate 100. As shown in FIG. 2A, the first dielectric layer 119 may be disposed on the semiconductor substrate 100, and correspondingly above two adjacent buried word lines 104A and 104B of each of the word line groups 104. The first dielectric layers 119 corresponding to each of the word line groups 104 may have openings 120 therebetween. In some embodiments, the first dielectric layer 119 may include dielectric materials, such as spin-on dielectric (SOD). Suitable dielectric materials may be fully spin-on coated onto the semiconductor substrate 100, and the dielectric materials may be patterned by dry etching method, to form the first dielectric layers 119 as shown in FIG. 2A. In some embodiments, materials of the first dielectric layers 119 may be, for example, tetraethoxysilane (TEOS), but the present disclosure is not limited to this material. Materials of the first dielectric layers 119 may also be one or more combinations of dielectric materials.

Figure 2B:
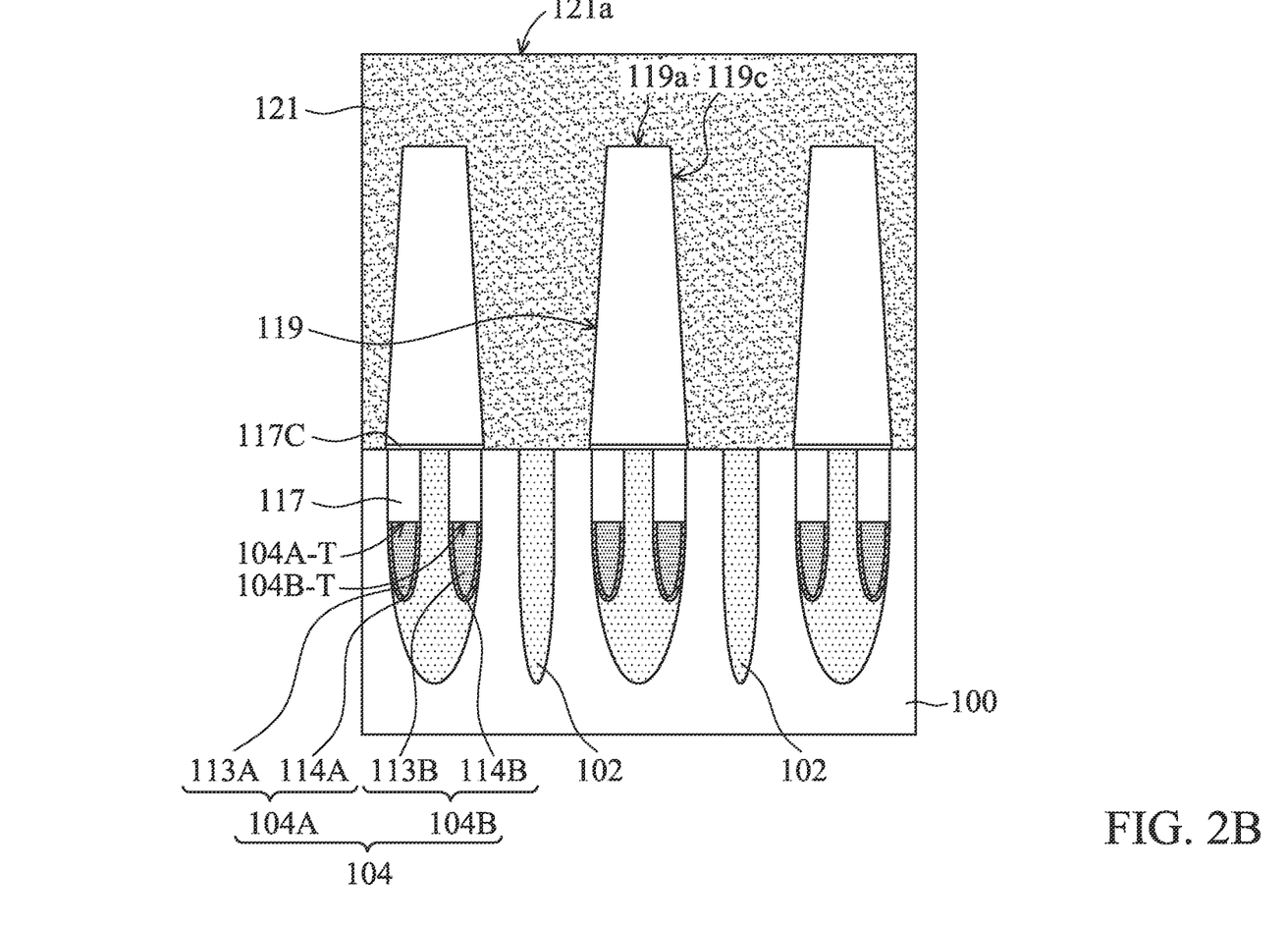

Next, refer to FIG. 2B, a conductive material 121 may be formed on the semiconductor substrate 100, while the conductive material 121 may cover the first dielectric layers 119 and may fill the openings 120. In some embodiments, the conductive material 121 may cover all top surfaces 119a and sidewalls 119c of the first dielectric layers 119, and may also cover surfaces of the semiconductor substrate 100 exposed between the first dielectric layers 119. In other words, as shown in FIG. 2B, a top surface 121a of the conductive material 121 may be higher than the top surfaces 119a of the first dielectric layers 119. In some embodiments, the conductive material 121 may be, for example, doped or un-doped polysilicon, which may be formed on the semiconductor substrate 100 using chemical vapor deposition. Through subsequent processes of patterning, the conductive material 121 may be a part of a contact plug.

Figure 2C:
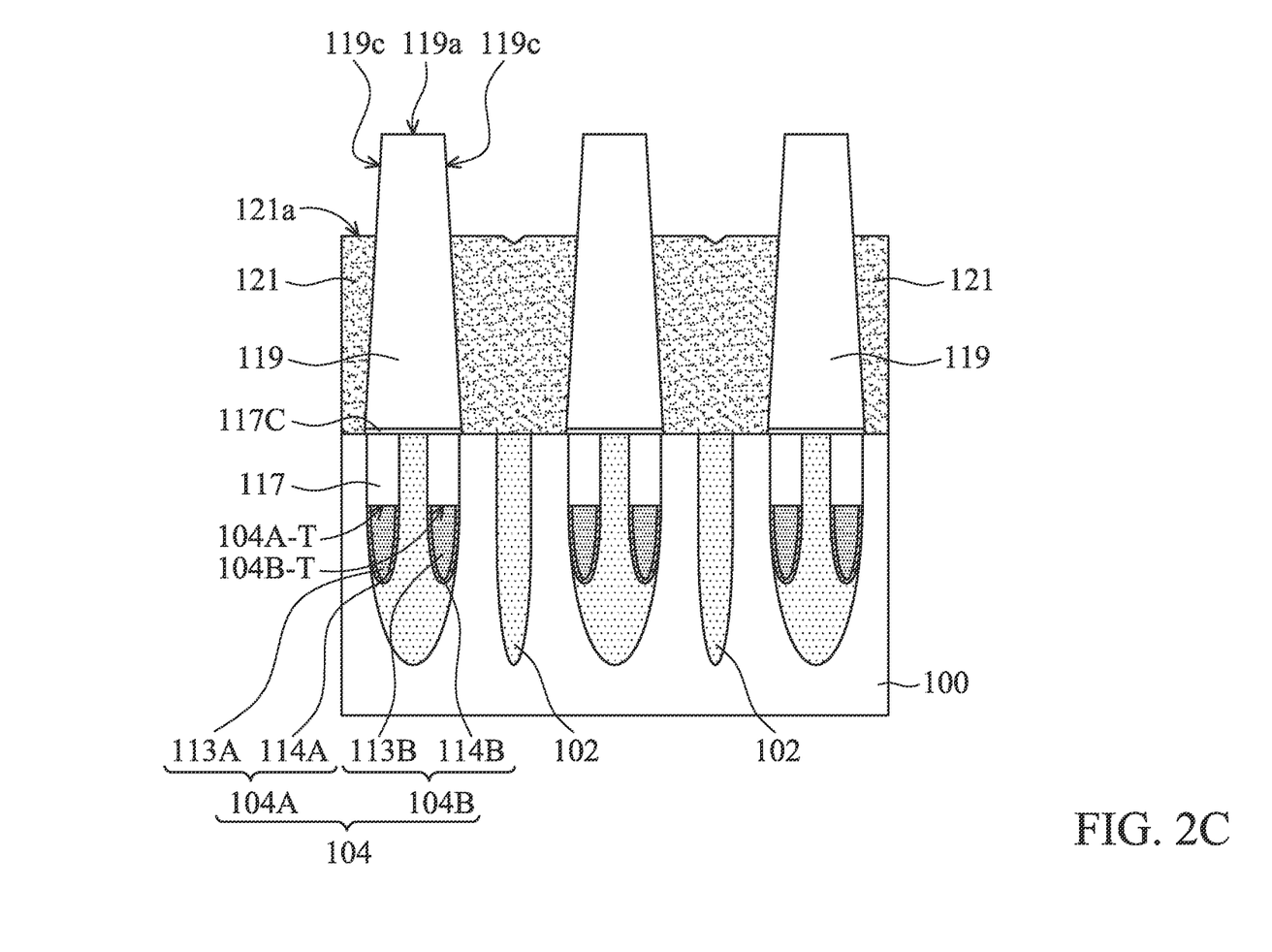

After that, refer to FIG. 2C. A portion of the conductive material 121 may be removed to expose the top surfaces 119a and a portion of sidewalls 119c of the first dielectric layers 119. After the removal, a top surface 121a of the conductive material 121 is lower than the top surface 119a of the first dielectric layers 119. In some embodiments, etching back processes may be performed to remove a portion of the conductive material 121.

Figure 2D:
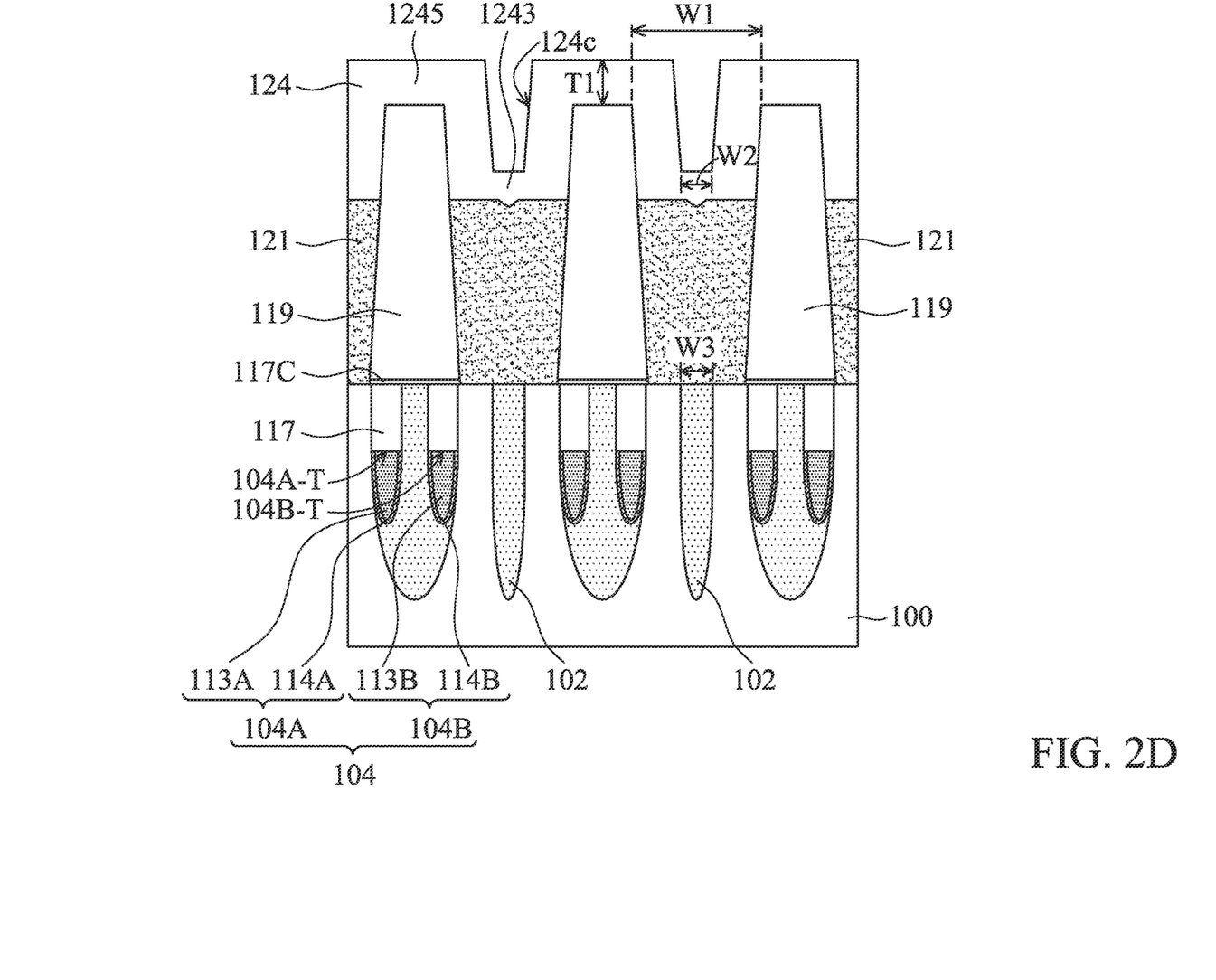

Next, refer to FIG. 2D. A mask layer 124 may be deposited onto the conductive material 121, including conformally depositing the mask layer 124 on the top surfaces 119a and the portion of sidewalls 119c of the first dielectric layers 119. The mask layer 124 may include a plurality of valley portions 1243 and a plurality of peak portions 1245, wherein the valley portions 1243 may approximately correspond to the shallow trench isolation structures 102, and the peak portions 1245 may approximately correspond to the first dielectric layers 119. In one embodiment, materials of the mask layer 124 may be, for example, silicon nitride, and the mask layer 124 may be formed on the conductive material 121 using atomic layer deposition (ALD).

In some embodiments, if the width between two adjacent first dielectric layers 119 on the first direction D1 is defined as width W1, and then a thickness T1 of the mask layer 124 may be greater than ¼ of the width W1, and smaller than ½ of the width W1, for example, about ⅓ of the thickness W1. The thickness T1 of the mask layer 124 may determine a width of the valley portions 1243. In some embodiments, for example, the valley portions 1243 of the mask layer 124 may have a width W2 on the first direction D1. Each of the shallow trench isolation structures 102 corresponding between two adjacent first dielectric layers 119 may have a width W3 on the first direction D1. The width W2 may be slightly greater than the width W3. By choosing and adjusting the thickness T1 of the mask layer 124, the width of the conductive layer 121 (such as a conductive layer 121A shown in FIG. 2E) formed on the first direction D1 and the dimensions of recesses (such as recesses 100R shown in FIG. 2E) formed on the semiconductor substrate 100 after subsequent self-aligned etching may be determined.

Figure 2E:
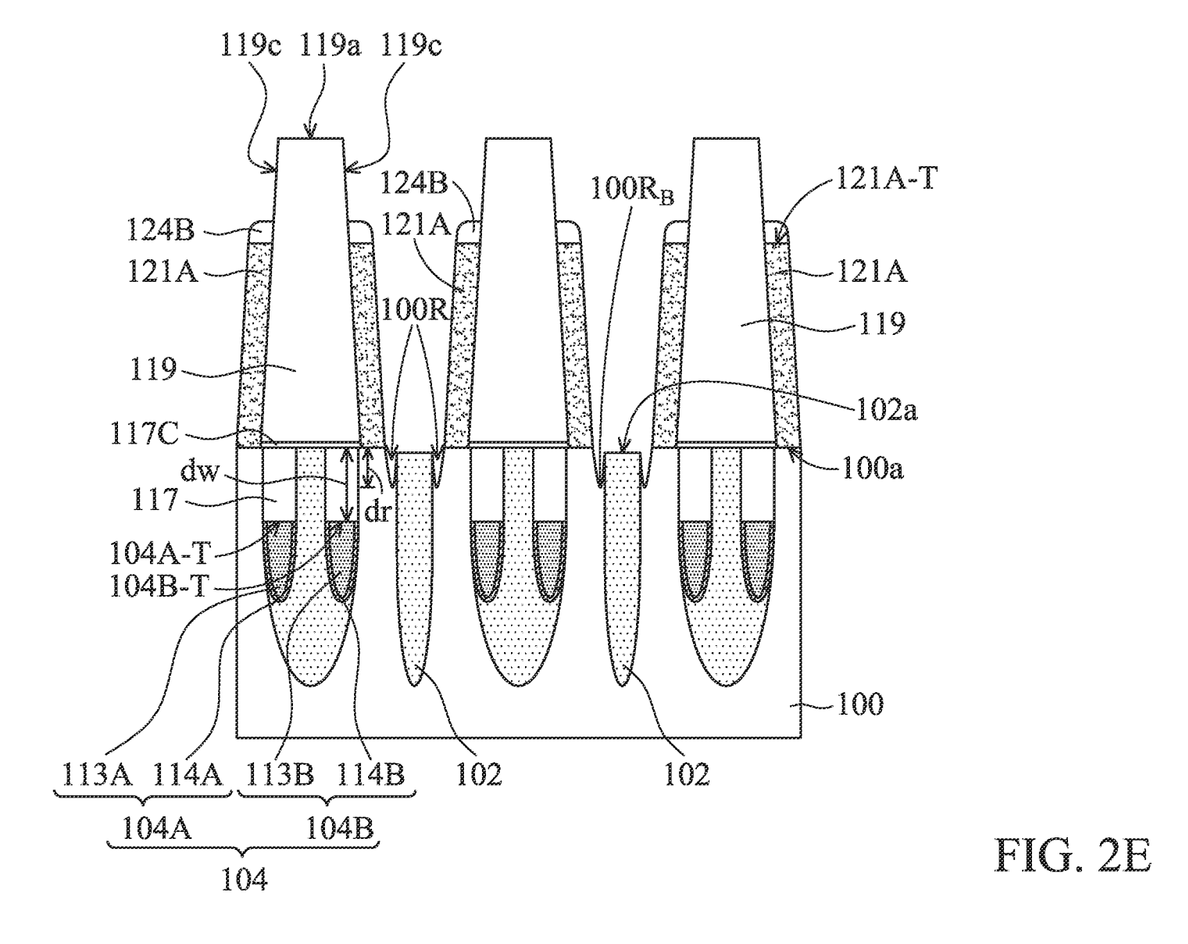

After that, refer to FIG. 2E. In some embodiments, etching is performed on the conductive material 121 with respect to the mask layer 124 (FIG. 2D), for example, etching downward along sidewalls 124c of the mask layer 124. A portion of the conductive material 121 and a portion of the semiconductor substrate 100 may be removed by over-etching, to form recesses 100R on the semiconductor substrate 100, wherein the conductive material 121 remains after the over-etching is a conductive layer 121A, and bottoms 100R$_B$ of the recesses 100R may be lower than top surfaces 102a of the shallow trench isolation structures 102.

In some embodiments, over-etching may be performed using dry etching methods, for example, reactive-ion etching (RIE). Since etching on the conductive material 121 only requires the mask layer 124, without applying additional masks, such over-etching is also known as self-aligned etching, where recesses 100R may be formed in a self-aligned manner.

Furthermore, refer to FIGS. 1 and 2E. In some embodiments, under the same over-etching procedure, the conductive material 121 over each of the shallow trench isolation structures 102 may be simultaneously removed, and the conductive layers 121A and the recesses 100R may be simultaneously formed on the semiconductor substrate 100 of different active areas $A_A$ on opposite sides of each of the shallow trench isolation structures 102. Additionally, after over-etching, mask materials 124B may be remained over the conductive layers 121A, as shown in FIG. 2E. Alternatively, the mask materials 124B may not be remained over the conductive layers 121A, but the present disclosure is not limited hereto.

Additionally, the aforementioned over-etching may be, for example, one-step procedure, two-step procedure, or multi-step procedure. For example, in a first etching, the conductive material 121 may be removed by etching downward along the sidewalls 124c of the mask layer 124, and a top surface 100a of the semiconductor substrate 100 may be exposed. Next, a second etching is performed, for example, process parameters of the etching process may be adjusted to form the recesses 100R on the semiconductor substrate 100.

It is worth noted that bottoms 100R$_B$ of the recesses 100R formed during the over-etching may be lower than the top surface 100a of the semiconductor substrate 100, and may also be lower than the top surfaces 102a of the shallow trench isolation structures 102, but may be higher than top surfaces 104A-T and 104B-T of the buried word lines 104A and 104B. As shown in FIG. 2E, the distance between the top surface 100a of the semiconductor substrate 100 and the top surfaces 104A-T/104B-T of the buried word lines 104A/104B may be a first depth dw, and the distance between the top surface 100a of the semiconductor substrate 100 and the bottom 100R$_B$ of the recesses 100R may be a second depth dr. The first depth dw and the second depth dr may be, for example, parallel along the second direction D2. In some embodiments, the second depth dr may be smaller than or equal to ½ of the first depth dw, and may be larger than or equal to ⅕ of the first depth dw. In some embodiments, the second depth dr may be about ⅓ of the first depth dw. In an embodiment, the first depth dw is about 50 nm, and the second depth dr is about 10 nm to 25 nm.

However, the ratio of the first depth dw to the second depth dr is not specifically limited hereto, as long as the conductive material 121 between two first dielectric layers 119, and between adjacent active areas $A_A$ may be completely removed after over-etching process, so the top surfaces 102a of the shallow trench isolation structures 102 may be exposed. The recesses 100R may be formed on the semiconductor substrate 100 on opposite sides of the top surfaces 102a of the shallow trench isolation structures 102, thereby ensuring complete insulation of the semiconductor substrate 100 on opposite sides of the shallow trench isolation structures 102. The aspects described may all belong to embodiments of the present disclosure.

Figure 2F:
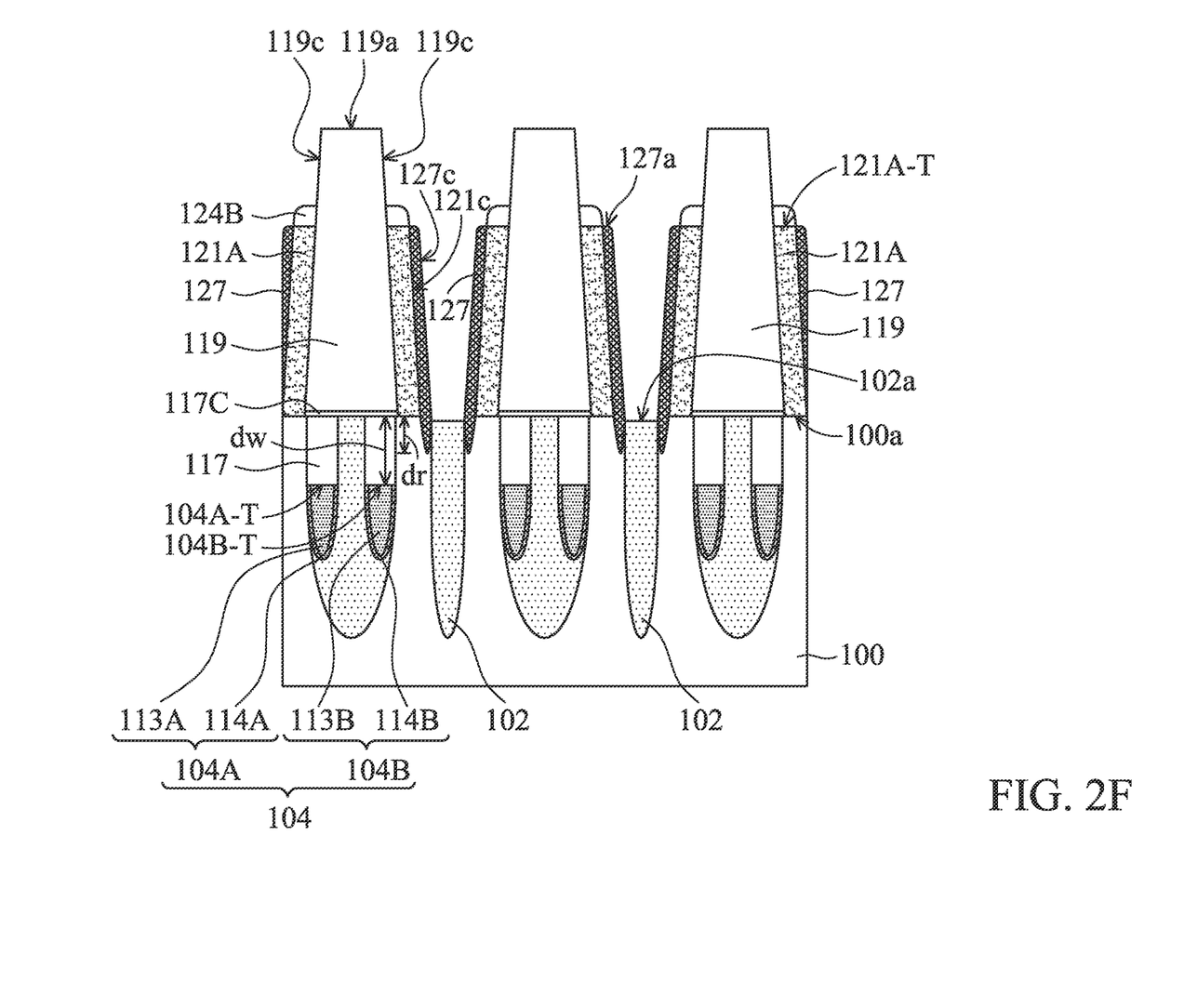

Next, refer to FIG. 2F. A selective epitaxial growth (SEG) may be performed to form epitaxial layers 127, wherein the epitaxial layers 127 may be disposed on sidewalls 121c of the conductive layers 121A and extending into the semiconductor substrate 100, filling the recesses 100R.

In some embodiments, the conductive layers 121A may include, for example, polysilicon, and the semiconductor substrate 100 may include, for example, silicon. Therefore, during selective epitaxial growth, the epitaxial layers 127 may be formed on silicon-containing material layers. In some embodiments, top surfaces 121A-T of the conductive layers 121A may be covered by the mask material 124B, as shown in FIGS. 2E and 2F, and only the sidewalls 121c of the conductive layers 121A may be exposed. Therefore, during selective epitaxial growth, epitaxial silicon may be grown on the sidewalls 121c of the conductive layers 121A and the recesses 100R of the semiconductor substrate 100. As shown in FIG. 2F, the epitaxial layers 127 may be formed on the sidewalls 121c of the conductive layers 121A (for example, the exposed sidewalls 121c of the conductive layers 121A may be entirely covered), and the recesses 100R may be filled.

Furthermore, in some embodiments, the depth of the epitaxial layers 127 within the recesses 100R may also be the aforementioned second depth dr. The ratio and relationship between the distance between the top surface 100a of the semiconductor substrate 100 and the top surfaces 104A-T/104B-T of the buried word lines 104A/104B (or the first depth dw) and the second depth dr of the epitaxial layer 127 may be referred to what has been described previously, and the details are not described again herein to avoid repetition.

It is worth noted that in some embodiments, the epitaxial layers 127 and the conductive layers 121A formed may constitute as contact plugs of the memory device. The contact plugs may be, for example, the capacitor contacts 107 shown in FIG. 1. Therefore, the embodiments of the present disclosure may alleviate the issue of reduced contact areas between the active areas $A_A$ and the contact plugs (capacitor contacts 107) due to process offset, so the current may pass through the conductive layers 121A and the epitaxial layers 127, while maintaining a width of the current channel to reduce the resistance. Therefore, according to some embodiments of the present disclosure, the reduced operating speed issue of the memory device, which is caused by the reduced contact areas, may be resolved.

Figure 3:
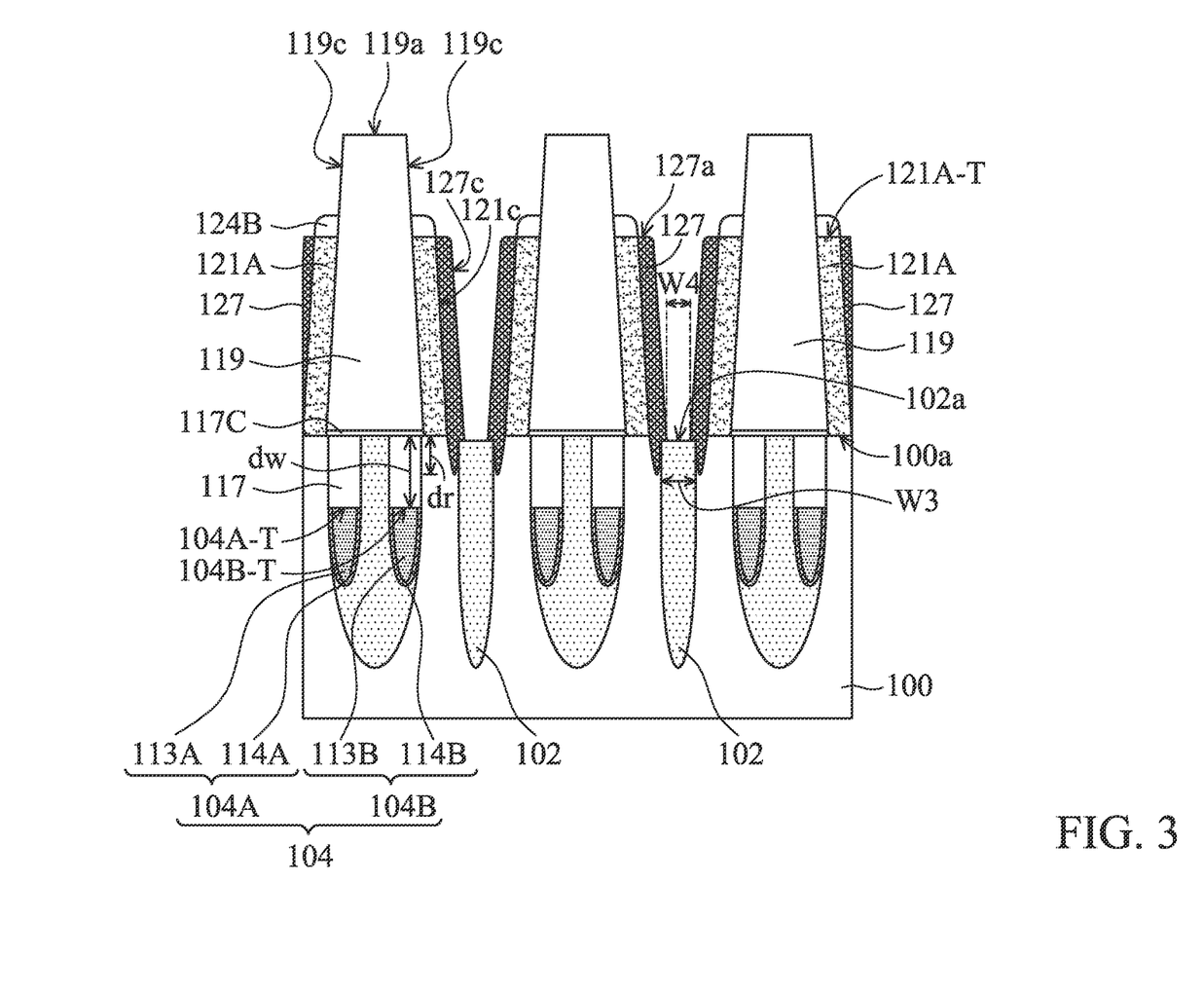
FIG. 3 is a cross-sectional view of a memory device having an epitaxial layer according to other embodiments of the present disclosure.

Additionally, in other embodiments, process parameters of the selective epitaxial growth may be adjusted and chosen, so the grown epitaxial layers 127 may at least fill the recesses 100R, and may even exceed beyond the location of recesses 100R toward the top surfaces 102a of the shallow trench isolation structures 102. FIG. 3 is a cross-sectional view of a memory device having the epitaxial layers 127 according to other embodiments of the present disclosure. In this example, after the selective epitaxial growth, the grown epitaxial layers 127 may fill the recesses 100R, and may cover a portion of the top surface 102a of the shallow trench isolation structures 102. But the epitaxial layers 127 of different active areas $A_A$ may be separated by at least a distance, and may not be interconnected. As shown in FIG. 3, a distance between the adjacent epitaxial layers 127 may have a width W4. In some examples, the width W4 may be about 80% to 100% of the width W3 of the top surfaces 102a of the shallow trench isolation structures 102, for example, about 90%, so the signals of the adjacent contact plugs may not interfere with each other.

Figure 2G:
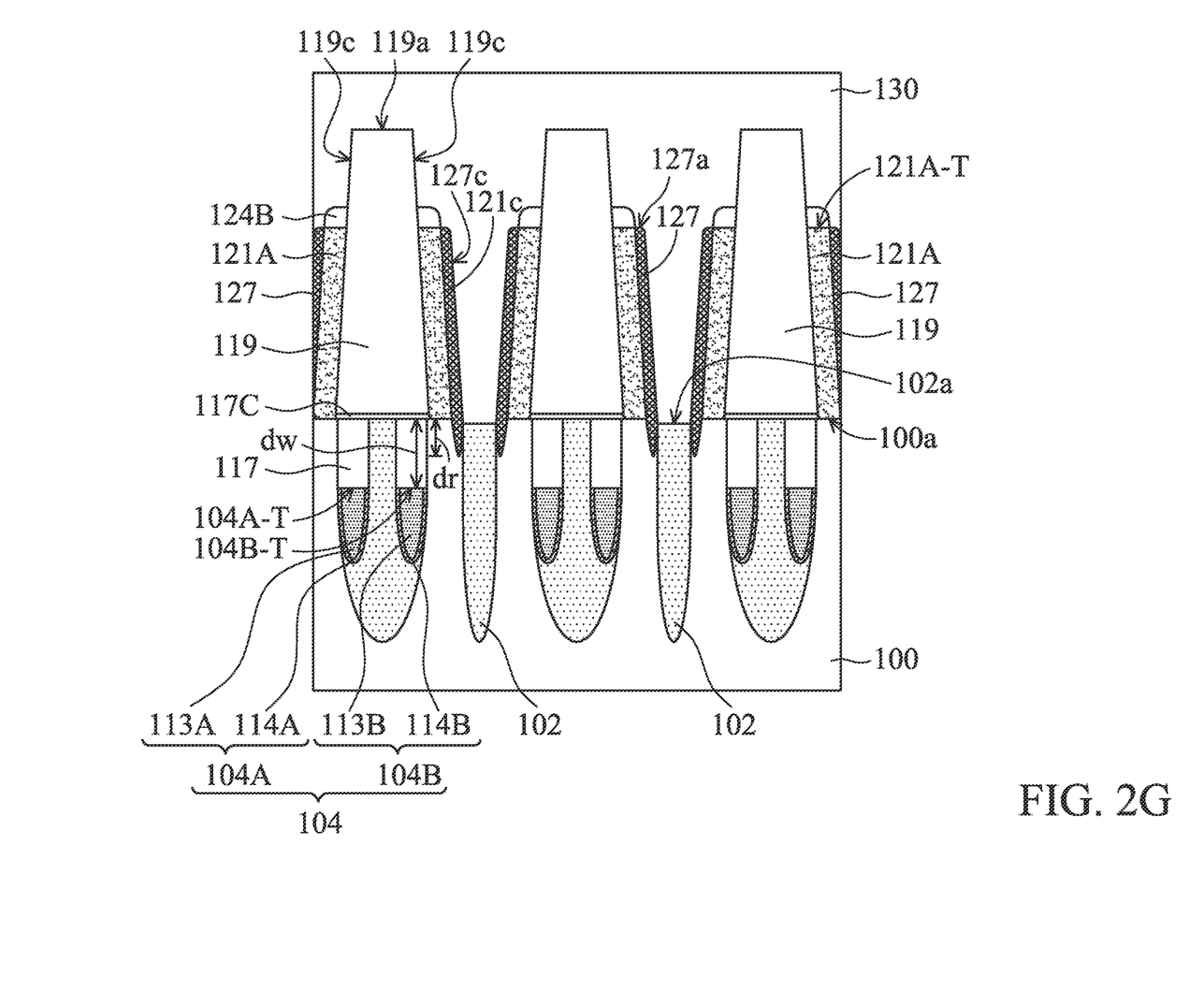

Then, refer to FIG. 2G. A second dielectric layer 130 may be formed on the semiconductor substrate 100, covering the first dielectric layers 119 and filling the space between the epitaxial layers 127. In some embodiments, the second dielectric layer 130 may be disposed over the conductive layers 121A, covering the top surfaces 127a and sidewalls 127c of the epitaxial layers 127. In other words, the second dielectric layer 130 may be in direct contact the epitaxial layers 127. In some embodiments, dielectric materials of the second dielectric 130 may be the same as the dielectric materials of the mask layer 124, for example, silicon nitride.

After the formation of the second dielectric layer 130, subsequent processes may proceed to complete the manufacture of the contact plugs. The following subsequent processes are proposed for illustration.

Figure 4A:
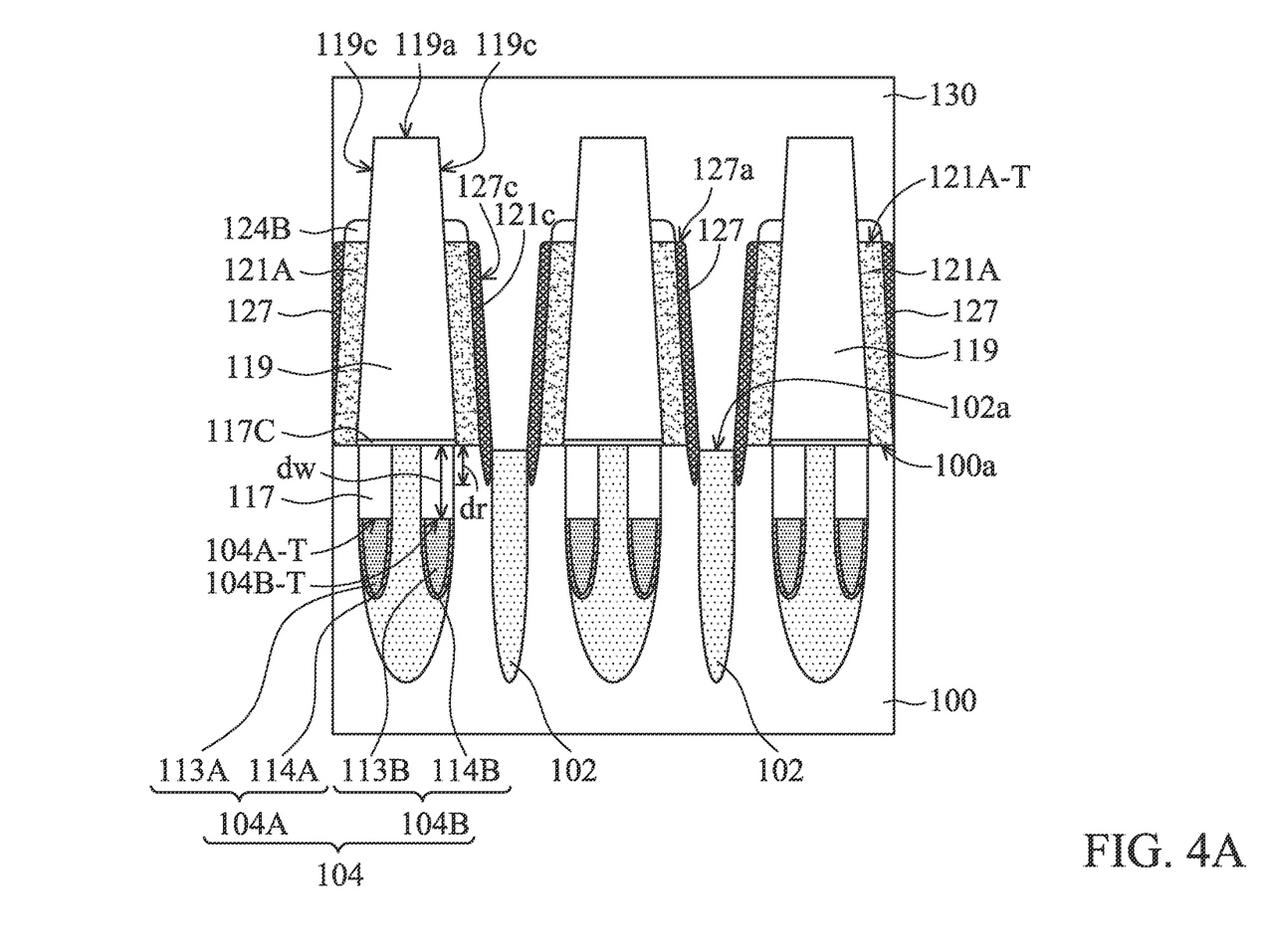
FIGS. 4A-4C are cross-sectional views of some intermediate stages of the memory device process after forming the epitaxial layer according to some embodiments of the present disclosure.
Figure 4B:
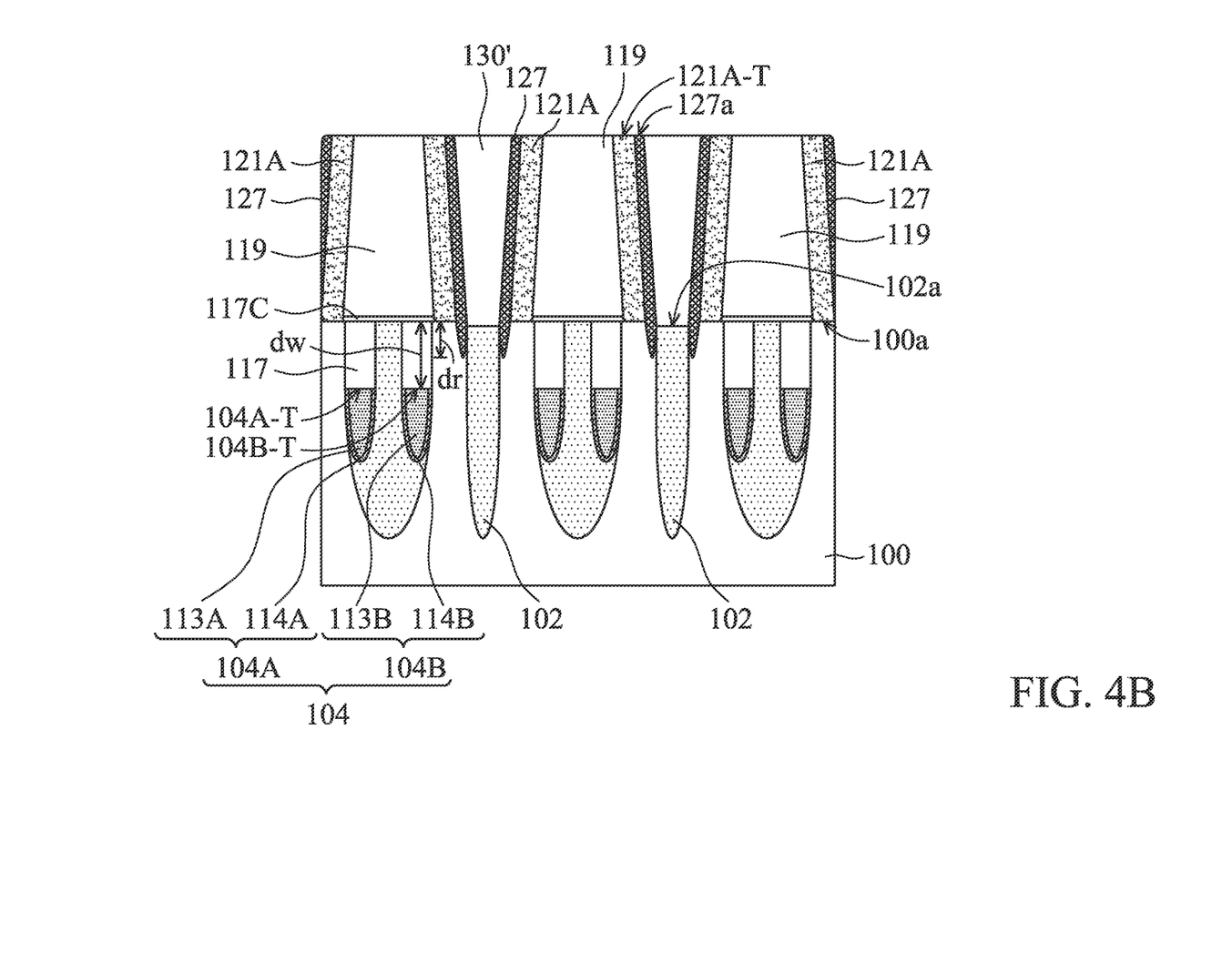
Figure 4C:
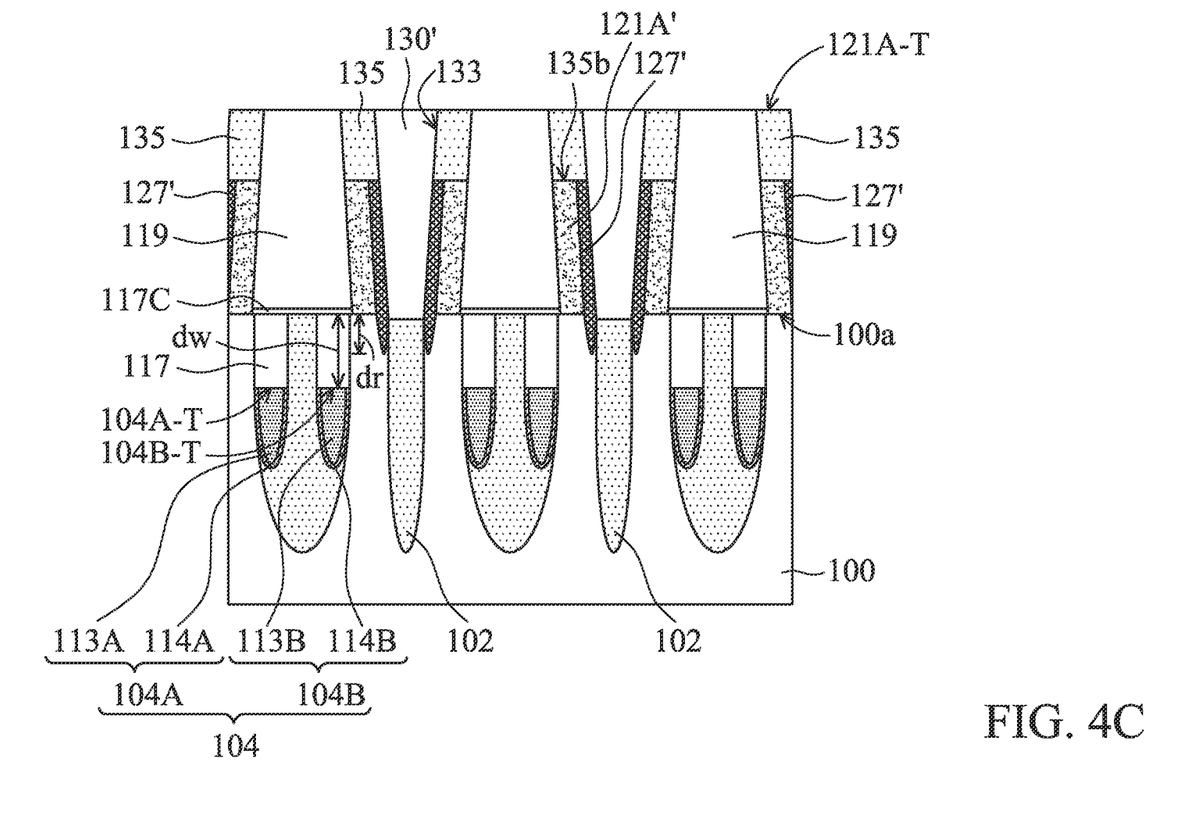

FIGS. 4A-4C are cross-sectional views of some intermediate stages of the memory device process after forming the epitaxial layers 127 according to some embodiments of the present disclosure. Each of the elements in FIG. 4A is identical with that of FIG. 2G, in which the elements and their manufacture may be referred to what has been described, and the details are not described again herein to avoid repetition.

Next, refer to FIG. 4B. In some embodiments, a planarization process may be performed to remove portions of the first dielectric layers 119 and a portion of the second dielectric layer 130 until the top surfaces 121A-T of the conductive layers 121A and the top surfaces 127a of the epitaxial layers 127 are exposed. After the planarization, the top surface of a second dielectric layer 130', the top surfaces 121A-T of the conductive layers 121A, and the top surfaces 127a of the epitaxial layers 127 may be coplanar. In some embodiments, the planarization processes may, for example, be a chemical mechanical polishing (CMP) process.

After that, refer to FIG. 4C, in some embodiments, after etching back, the conductive layers 121A and the epitaxial layers 127 may be recessed, for example, to form recessed holes 133. Next, other conductive layers 135 may be formed where the recessed holes 133 are, over conductive layers 121A' and epitaxial layers 127'. As shown in FIG. 4C, in some embodiments, the conductive layers 135 may span across the conductive layers 121A' and the epitaxial layers 127', and in direct contact with the conductive layers 121A' and the epitaxial layers 127'.

In some embodiments, materials of the conductive layers 135 may include, for example, copper, tungsten, tungsten nitride, titanium nitride, or other suitable metal-containing conductive materials. In one example, the conductive layers 135 may include metal bulks (for example, tungsten) and barrier layers (for example, titanium nitride) surrounding bottom surfaces and sidewalls of the metal bulks. In some embodiments, the formation of the conductive layers 135 may be chemical vapor deposition.

According to some embodiments, the aforementioned conductive layers 121A', the epitaxial layers 127', and the conductive layers 135 thereon are the contact plugs that constitute the memory device, wherein the conductive layers 121A' and the epitaxial layers 127' may together act as bottom contact portions of the contact plugs, the conductive layers 135 may act as top contact portions of the contact plugs. These contact plugs may also be the capacitor contacts 107 shown in FIG. 1. In some embodiments, since the conductive layers 121A' and the epitaxial layers 127' may be polysilicon and epitaxial silicon, respectively, the conductive layers 135 may include metal-containing conductive materials, wherein the resistance of the conductive layers 135 is lower than the resistance of the conductive layers 121A', and also lower than the resistance of the epitaxial layers 127'. Therefore, disposing the conductive layers 135 may reduce the compositions of the conductive layers 121A' and the epitaxial layers 127', thereby reducing the overall resistance of the contact plugs.

After that, a plurality of capacitor elements (not shown in FIG. 4C) may be formed over the contact plugs (or the capacitor contacts 107), respectively.

According to the aforementioned embodiments, the contact plugs under the capacitor elements may include conductive layers 135 (as the top contact portions), the conductive layers 121A' and the epitaxial layers 127' (as the bottom contact portions), wherein the conductive layers 135 may be, for example, tungsten-containing metal, the conductive layers 121A' may be, for example, polysilicon, the epitaxial layers 127' may be, for example, epitaxial silicon. Therefore, in some embodiments, if the cross-section of the memory device (especially the cross-sections of the bottom contact portions of the contact plugs) were to be observed by electronic microscopes, two different crystal types of the conductive layers 121A' and the epitaxial layers 127', and their interfaces, may be observed. For example, the conductive layers 121A' may be single crystals constituted by multiple different arrangements and orientations, and the epitaxial layers 127' may be single crystal layers grown on a plane and arranged regularly. Therefore, there may be clear interfaces between the conductive layers 121A' and the epitaxial layers 127'.

Based on the above, according to some embodiments of the present disclosure, the conductive material 121 may be patterned using over-etching method, not only ensuring the conductive layers 121A at different active areas $A_A$ may be completely separated, but also forming the recesses 100R of a certain depth on the semiconductor substrate 100. Therefore, the over-etching procedures of the embodiments may prevent short circuits due to insufficient etching of the remaining conductive material. According to some embodiments of the present disclosure, the epitaxial layers 127 may be formed on sidewalls 121c of the conductive layers 121A and the recesses 100R of the semiconductor substrate 100, using, for example, selective epitaxial growth, wherein the epitaxial layers 127 may fill the recesses 100R. By doing so, the contact areas between the active areas $A_A$ and the contact plugs (including the conductive layers 121A and the epitaxial layers 127) may be maintained. The issue of the reduced contact areas between active areas $A_A$ and the contact plugs due to offset in conventional process and the damage issue to the semiconductor substrate 100 may be alleviated. Therefore, according to the memory device proposed by the embodiments of the present disclosure, the contact areas between the active areas $A_A$ and the contact plugs may be maintained to reduce the contact resistance, thereby improving electrical characteristics and operating performance of the memory device. Additionally, according to the process methods proposed by some embodiments of the present disclosure, the thickness of the mask layer 124 may be adjusted using self-aligned etching procedures, based on the requirements of applying actual conditions, to etch the conductive materials 121 below and to achieve the conductive layers 121A and the width between the recesses 10R formed subsequently, without having to dispose additional masks for etching. Therefore, according to the manufacturing methods of the memory device proposed by the embodiments of the present disclosure, process procedures may be simplified, the quantity of masks used may be reduced, thereby lowering the process cost.

Even though the foregoing outlines features of several embodiments, the present disclosure is not limited hereto. Those skilled in the art may make various changes and alterations herein without departing from the spirit and scope of the present disclosure. The scope of the present disclosure should be based on the scope of the claims listed below.

What is claimed is:

1. A memory device, comprising:
    a semiconductor substrate, comprising a shallow trench isolation structure and an active area on one side of the shallow trench isolation structure;
    two adjacent buried word lines disposed in the semiconductor substrate and separated from each other;
    a first dielectric layer disposed on the semiconductor substrate and correspondingly above the two adjacent buried word lines;
    a contact plug disposed on the semiconductor substrate within the active area, wherein the contact plug comprises:
        a conductive layer disposed on sidewalls of the first dielectric layer; and
        an epitaxial layer disposed on sidewalls of the conductive layer and extending into the semiconductor substrate;
    a second dielectric layer disposed on the semiconductor substrate and covering the contact plug and the shallow trench isolation structure.

2. The memory device of claim 1, wherein a bottom surface of the epitaxial layer is lower than a top surface of the shallow trench isolation structure, but higher than a top surface of the buried word lines.

3. The memory device of claim 1, wherein the second dielectric layer is in direct contact with the epitaxial layer.

4. The memory device of claim 1, wherein the conductive layer is a polysilicon layer, and the epitaxial layer is an epitaxial silicon layer.

5. The memory device of claim 1, wherein the contact plug further comprises another conductive layer disposed on the conductive layer and the epitaxial layer, and directly contacting the conductive layer and the epitaxial layer, wherein a resistance of the aforementioned other conductive layer is lower than a resistance of the conductive layer.

6. The memory device of claim 1, wherein the active area is a first active area, the conductive layer and the epitaxial layer are a first conductive layer and a first epitaxial layer, respectively, and the semiconductor substrate further comprises:
    a second active area, wherein the first active area and the second active area are disposed on opposite sides of the shallow trench isolation structure, respectively, the second active area has a second contact plug, wherein the second contact plug comprises a second conductive layer and a second epitaxial layer disposed on sidewalls of the second conductive layer, wherein the second dielectric layer is disposed between the first epitaxial layer and the second epitaxial layer.

7. A method of manufacturing a memory device, comprising:
    providing a semiconductor structure, comprising a semiconductor substrate, a shallow trench isolation structure disposed in the semiconductor substrate, a dielectric layer disposed on the semiconductor substrate, and a conductive material disposed on the semiconductor substrate and covering the semiconductor substrate;

etching the conductive material to expose the shallow trench isolation structure and to remove a portion of the semiconductor substrate, thereby forming a recess on the semiconductor substrate, wherein the conductive material remains after the etching is a conductive layer, and the conductive layer is disposed on sidewalls of the dielectric layer; and performing epitaxial growth to form an epitaxial layer on sidewalls of the conductive layer, wherein the epitaxial layer fills the recess.

8. The method of claim 7, wherein the semiconductor structure further comprises: two adjacent and separated buried word lines disposed in the semiconductor substrate, wherein the dielectric layer on the semiconductor substrate is disposed correspondingly above the two adjacent buried word lines.

9. The method of claim 7, wherein the conductive layer is a polysilicon layer and the epitaxial layer is an epitaxial silicon layer.

10. The method of claim 7, wherein the etching of the conductive material comprises:

removing a portion of the conductive material to expose a top surface and a portion of the sidewalls of the dielectric layer;

conformally depositing a mask layer on the top surface and the portion of the sidewalls of the dielectric layer;

performing etching with respect to the mask layer, to remove a portion of the conductive material and to expose the shallow trench isolation structure, and to remove a portion of the semiconductor substrate to form the recess in a self-aligned manner, wherein a bottom of the recess is lower than a top surface of the shallow trench isolation structure.

11. The method of claim 7, after forming the epitaxial layer, further comprising:

forming another dielectric layer on the semiconductor substrate, and the another dielectric layer is disposed over the conductive layer and covering a top surface and sidewalls of the epitaxial layer;

etching back the another dielectric layer to expose a top surface of the conductive layer and the top surface of the epitaxial layer;

recessing the conductive layer and the epitaxial layer; and forming another conductive layer over the conductive layer and the epitaxial layer.

* * * * *